(12) United States Patent
   Lamers

(10) Patent No.: US 9,515,041 B2
(45) Date of Patent: Dec. 6, 2016

(54) METHOD FOR BONDING A CHIP TO A SUBSTRATE

(71) Applicant: OCE-TECHNOLOGIES B.V., Venlo (NL)

(72) Inventor: Norbert H. W. Lamers, Reuver (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 20 days.

(21) Appl. No.: 14/537,350

(22) Filed: Nov. 10, 2014

(65) Prior Publication Data

US 2015/0062248 A1 Mar. 5, 2015

Related U.S. Application Data

(63) Continuation of application No. PCT/EP2013/060733, filed on May 24, 2013.

(30) Foreign Application Priority Data

May 24, 2012 (EP) .................................. 12169330

(51) Int. Cl.
  *H01L 23/00* (2006.01)
  *B41J 2/14* (2006.01)
(52) U.S. Cl.
  CPC ............... *H01L 24/27* (2013.01); *B41J 2/14* (2013.01); *B41J 2/14024* (2013.01); *H01L 24/83* (2013.01); *H01L 2224/278* (2013.01); *H01L 2224/27312* (2013.01); *H01L 2224/83047* (2013.01); *H01L 2224/8385* (2013.01); *H01L 2224/83143* (2013.01)

(58) Field of Classification Search
  CPC ......... B41J 2/14; B41J 2/14233; B41J 2/1631; B41J 2/1628; H01L 24/27; H01L 24/83
  See application file for complete search history.

(56) References Cited

U.S. PATENT DOCUMENTS

| 6,334,661 | B1 * | 1/2002 | Steinfield | B41J 2/14024 347/20 |
|---|---|---|---|---|
| 2002/0036678 | A1 | 3/2002 | Ito et al. | |
| 2006/0024477 | A1 * | 2/2006 | Ito | 428/137 |
| 2008/0084460 | A1 * | 4/2008 | Ito | 347/71 |
| 2009/0315946 | A1 * | 12/2009 | Koseki | 347/47 |

FOREIGN PATENT DOCUMENTS

| EP | 1870240 A1 | 12/2007 |
|---|---|---|
| EP | 2133204 B1 | 11/2012 |
| JP | 11-10894 A | 1/1999 |
| JP | 2002-307687 A | 10/2002 |

\* cited by examiner

*Primary Examiner* — Julian Huffman
*Assistant Examiner* — Jeremy Delozier
(74) *Attorney, Agent, or Firm* — Birch, Stewart, Kolasch & Birch, LLP

(57) ABSTRACT

A method is provided for bonding a chip to a substrate, the method comprising the steps of providing a chip, providing a substrate, providing a recess in one of the chip and the substrate, arranging the chip and the substrate in contact with each other thereby forming a predetermined contact area and at least partly covering the recess by the other one of the chip and the substrate, and providing an amount of liquid adhesive in the recess for providing a bonding layer.

11 Claims, 9 Drawing Sheets

METHOD FOR BONDING A CHIP TO A SUBSTRATE

CROSS REFERENCE TO RELATED APPLICATIONS

This application is a Continuation of PCT International Application No. PCT/EP2013/060733, filed on May 24, 2013, which claims priority under 35 U.S.C. 119(a) to patent application Ser. No. 12/169,330.3, filed in Europe on May 24, 2012, all of which are hereby expressly incorporated by reference into the present application.

FIELD OF THE INVENTION

The present invention relates to a method for bonding a chip to a substrate. The present invention further relates to a substrate for use in the method according to the present invention. The present invention further relates to a chip for use in the method according to the present invention. The present invention further relates to an inkjet print head for ejecting droplets of fluid, which inkjet print head comprises at least one of the substrate and the chip according to the present invention, wherein the chip and substrate are bonded by an adhesive.

BACKGROUND OF THE INVENTION

In a known method for bonding a chip to a substrate, in a first step a liquid adhesive is provided onto the surface of the substrate. In a next step the chip is arranged with respect to the substrate and brought in contact with the liquid adhesive in order to form a bonding layer in a bonding area, which is the area wherein the chip is intended to be bonded to the substrate. During this step the liquid adhesive is pushed sideways between the chip and the substrate due to forces provided by the chip and the substrate on the liquid adhesive.

It has appeared that a movement and a resulting position of the liquid adhesive on the surface of the substrate are not accurately controlled at the time of the bonding process. Usually the liquid adhesive which is provided to form the bonding layer has a low viscosity upon application such that a thin bonding layer of liquid adhesive may be provided. In particular a control on a resulting position of the liquid adhesive becomes worse in case the liquid adhesive easily flows due to a further reduction of the viscosity of the liquid adhesive, for example in case an elevated temperature is provided during a bonding process. Hence, during the bonding process some liquid adhesive is moved outside of the bonding area.

Thus, it has appeared that the amount of liquid adhesive being arranged inside the bonding area and the amount of liquid adhesive being moved outside of the bonding area are not accurately controlled. A position of the chip with respect to the substrate is not accurately maintained during the curing process of the liquid adhesive, caused by the inaccurate control on a position of the liquid adhesive, thereby leading to a misalignment between the substrate and the chip after curing.

It is therefore desirable to have a method of bonding a chip to a substrate that eliminates or at least diminishes the misalignment of the chip with respect to the substrate.

SUMMARY OF THE INVENTION

This object is attained by a method for bonding a chip to a substrate, the method comprising the steps of:

a) providing a chip;
b) providing a substrate;
c) providing a recess in one of the chip and the substrate;
d) arranging the chip and the substrate in contact with each other thereby forming a predetermined contact area and at least partly covering the recess by the other one of the chip and the substrate; and
e) providing an amount of liquid adhesive in the recess for providing a bonding layer.

In step c) a recess is provided in one of the chip and the substrate. The recess is provided in order to accommodate and confine an amount of liquid adhesive for providing a bonding layer during step e). The amount of liquid adhesive may substantially entirely be accommodated and confined in the recess. Alternatively a part of the amount of liquid adhesive, which is provided in step e), is accommodated and confined in the recess. In a preferred embodiment a largest part of the amount of liquid adhesive, which is provided in step e), is accommodated and confined in the recess. Attributes of the recess, such as depth, width and position, may be suitably selected in order to enhance confinement and positioning of the amount of liquid adhesive in the recess for providing a suitable bonding layer. As a result a bonding layer after a curing step of the amount of liquid adhesive may be optimized. The recess may comprise a groove, a round cavity, an elongated cavity extending in a longitudinal direction, a hole extending to another surface of said one of chip and the substrate, etc. The groove may have at least one end (e.g. a straight groove, a cross-shaped groove) and may be endless (e.g. a circular-shaped groove).

In step d) the chip and the substrate are arranged in contact with each other in order to form a direct contact in the predetermined contact area without an adhesive being arranged between the chip and the substrate. A direct contact between the chip and the substrate in the predetermined contact area is maintained during a curing step and after bonding. As used herein a direct contact in the predetermined contact area is a contact, wherein no adhesive or substantially no adhesive is arranged between the chip and the substrate. As an example a porous substrate may contain an amount of adhesive at the interface to the chip while at the same time having a direct mechanical contact to the chip. The direct contact between the chip and the substrate provides a friction force between the chip and the substrate during a bonding step of the chip to the substrate which enhances an accurate maintenance of an aligned position of the chip with respect to the substrate during the curing step and after bonding. Properties of the predetermined contact area, such as a position and dimensions of the predetermined contact area, may be selected by a person skilled in the art in order to optimize a friction force between the chip and the substrate. As a result a misalignment of the chip with respect to the substrate after bonding may be eliminated or at least diminished.

As used herein a chip comprises a pressure chamber configured for containing a fluid, an actuator configured for providing a fluid pressure in the pressure chamber and a fluid channel for providing a fluid communication from a fluid channel of the substrate towards the pressure chamber. In an embodiment, the chip comprises a plurality of pressure chambers, a plurality of piezoelectric actuators each being operatively coupled to a pressure chamber for generating a pressure change in the fluid in a pressure chamber and a plurality of fluid channels each providing a fluid communication from a fluid channel of the substrate to one of the pressure chambers. The chip may optionally comprise an orifice plate surface comprising a plurality of orifices or the chip may alternatively be bonded to an orifice plate. Preferably the orifice plate is bonded to the chip prior to the step d) arranging the chip and the substrate in contact with each other. This has the advantage that the orifice plate of the chip is accurately positioned during step d) with respect to the substrate.

In step d) the chip and the substrate are arranged with respect to each other in order to at least partly cover the recess by the other one of the chip and the substrate. In an embodiment the recess may be partly covered after step d) or, in another embodiment, the recess may be substantially completely covered after step d). An advantage of only partly covering the recess in step d) is that the recess and any adhesive present in the recess may be visually monitored during and after step e).

In step e) an amount of liquid adhesive is provided in the recess. The amount of liquid adhesive is provided in the recess in order to provide a bonding layer between the substrate and the chip. In the bonding layer the liquid adhesive in the recess is at the same time in contact with the substrate and in contact with the chip. As a result the chip is bonded to the substrate after a curing step of the liquid adhesive. Furthermore by a suitable selection of the amount of liquid adhesive and of recess position and shape the bonding layer is provided in a bonding area which is suitable for accurately bonding the chip to the substrate.

The method provides accurate control on the bonding area and the contact area and thereby improves an accurate alignment of the chip with respect to the substrate. The alignment of the chip is controlled both in a lateral direction and in a height direction (being substantially perpendicular to the lateral direction) with respect to the substrate. The height position of the chip is accurately controlled due to the direct contact to the substrate in the contact area.

The bonding area is preferably arranged adjacent to the contact area. The contact area may be surrounded by the bonding area. Alternatively the bonding area may be surrounded by the contact area.

Furthermore it has appeared that, with a suitable selection of recess position and shape, an alignment stability of the bonded chip is increased due to a resulting accurate control on the mechanical forces provided by the bonding area and the contact area. For example the alignment stability of the chip with respect to the substrate under an external load is improved. For example the alignment stability is improved towards an elevated temperature or an external mechanical load, such as during further processing of the bonded chip or in operation conditions of the bonded chip.

Furthermore it has shown that, due to the improved control on the bonding layer in the predetermined bonding area, the amount of liquid adhesive may be minimized while maintaining a sufficient bonding force in order to bond the chip to the substrate. In an example of the method, a plurality of recesses is arranged along a perimeter of the predetermined contact area and in each of the plurality of recesses an amount of liquid adhesive is provided. Thereby the total bonding area and the total amount of liquid adhesive may be minimized. This method provides a reduction in a processing time for curing the liquid adhesive and thereby increases the production speed.

In an embodiment of the method, step d) comprises arranging the chip and the substrate such that at least a part of a perimeter of said other one of the chip and the substrate is arranged over the recess. In this embodiment the recess is not completely covered by said other one of the chip and the substrate. This embodiment provides that step e) may be performed after step d). For example by providing the amount of adhesive via a portion of the recess which is not covered by said other one of the chip and the substrate. Another advantage is that after step d) a position of the amount of adhesive inside the recess may be observed visually. The open area of the recess after step d) may support a degassing process during filling of the recess during step e), and may support a curing process of the amount of liquid adhesive inside the recess induced by radiation, such as a curing process induced by ultraviolet radiation.

In a particular embodiment of the method, the recess extends in a first longitudinal direction and wherein step d) comprises arranging a part of the perimeter of said other one of the chip and the substrate along the first longitudinal direction such that the recess is partly covered in a second direction, which is substantially perpendicular to the first longitudinal direction in the plane of the predetermined contact area. In this embodiment the first longitudinal direction of the recess and a part of the perimeter of said other one of the chip and the substrate are aligned. This method provides that along the first longitudinal direction the recess has a configurable open area after step d). The open area in this embodiment supports visual inspection of the recess and the adhesive, which is present in the recess after step e), along the first longitudinal direction of the recess. The open area along the first longitudinal direction may further support an uniform arrangement of the amount of liquid adhesive along the first longitudinal direction of the recess and may support a curing process of the amount of liquid adhesive inside the recess induced by radiation, such as a curing process induced by ultraviolet radiation.

In an embodiment of the method, the recess provided in step c) further comprises a predetermined depth and after step e) a bonding layer is provided in the recess for bonding the chip to the substrate comprising a predetermined thickness. In this embodiment a depth of the recess is predetermined in order to provide a bonding layer in the recess having a predetermined thickness. The thickness of the bonding layer may be predetermined based on a desired bonding force or on a desired resilience of the bonding layer between the chip and the substrate. As a result of the predetermined depth of the recess the bonding properties, such as force and resilience, of the bonding layer may be optimized. The depth of the recess may be uniform along a direction of the recess and may be varied along a direction of the recess in order to optimize the bonding properties, such as force and resilience, of the bonding layer.

In an embodiment of the method, step e) is performed prior to step d). In this embodiment the amount of liquid adhesive is provided in the recess prior to step d). This method provides the advantage that the recess as a whole is easily accessible during step e).

In an embodiment of the method, the recess is partly filled during step e) prior to step d) and the method further comprises a step f) adding a second amount of liquid adhesive in the recess after step d) to the amount of liquid adhesive provided in step e). During step f) the bonding layer is formed between the chip and the substrate.

In the first place the duration for forming the bonding layer during step e) and step f) is minimized due to easy access of the recess during step e) prior to step d). In the second place in this embodiment the confinement of the amount of the liquid adhesive in the recess is enhanced as during step f) the recess is at least partly covered by the other one of the chip and the substrate due to step d).

In a particular embodiment of the method, the recess is substantially completely covered by said other one of the chip and the substrate after step d). This method provides the advantage that a flow of liquid adhesive onto the same surface of the chip and the substrate as the predetermined contact area is prohibited after the recess has been fully covered. For example after step d) the chip and substrate may be moved together while the flow of liquid adhesive is restricted to the recess itself.

In this embodiment the recess may be fully closed by said other one of the chip and the substrate after step d). Alternatively the recess may additionally have an opening at another surface of the corresponding chip or substrate, different from the surface of the corresponding chip or substrate corresponding to the bonding area. The opening at the other surface may be used for degassing the recess and/or enabling overflow of an excess amount of liquid adhesive during and after step d).

In an embodiment of the method, the recess comprises a filling portion and wherein after step d) the filling portion is not covered by said other one of the chip and the substrate and step e) comprises providing the amount of liquid adhesive via the filling portion in the recess. The filling portion provides an easy and configurable access to the recess for providing the amount of liquid adhesive during step e).

In a particular embodiment of the method, the recess further comprises a degassing portion and wherein after step d) the degassing portion is not covered by said other one of the chip and the substrate. The degassing portion provides a configurable degassing means for easily degassing the recess during step e). The degassing portion is especially advantageous in case a large portion of the recess is covered after step d) before performing step e).

In a particular embodiment of the method, the recess further comprises a groove and wherein step c) comprises configuring the recess such that during or after step e) the liquid adhesive provided is moved by capillary forces along a longitudinal direction of the groove. In this embodiment an attribute of the recess may be configured to enhance capillary movement of the liquid adhesive along the longitudinal direction of the groove. The groove may have a uniform dimension (such as width and depth) along the longitudinal direction of the groove and may have a varying dimension along the longitudinal direction of the groove. The inner surface properties of the recess may be adjusted in order to enhance capillary movement of the liquid adhesive along the longitudinal direction of the groove. The amount of liquid adhesive may easily arrange along the longitudinal direction of the groove by capillary forces.

In a particular embodiment of the method, the recess further comprises a groove and wherein step e) comprises providing pressure to the liquid adhesive in the filling portion in order to move the liquid adhesive along a longitudinal direction of the groove. In this embodiment the pressure may be provided to the liquid adhesive in the filling portion in order to move the liquid adhesive along a longitudinal direction of the groove at the same time as providing the amount of liquid adhesive in the filing portion. This has the advantage that a volume of the filling portion may be selected smaller than a volume of the amount of liquid adhesive provided in the recess. Alternatively the pressure may be provided to the liquid adhesive in order to move the liquid adhesive along a longitudinal direction of the groove after the amount of liquid adhesive has been provided in the filing portion.

In a particular embodiment of the method, a volume of the filling portion is selected based on the amount of liquid adhesive, and wherein step e) comprises temporarily retaining the amount of liquid adhesive in the filling portion. In this embodiment the volume of the filing portion is selected equal to or larger than a volume of the amount of liquid adhesive provided in the recess. The amount of liquid adhesive is temporarily retained in the filling portion. In a subsequent phase of step e) the liquid adhesive is moved out of the filling portion and is arranged along the recess. The subsequent phase may be enhanced by providing pressure to the liquid adhesive in the filling portion, may be enhanced by elevating a temperature of the liquid adhesive, may be enhanced by capillary forces and may be enhanced in any other way.

In an aspect of the present invention a substrate is provided for use in the method according to the present invention, the substrate comprising a predetermined contact area on an outer surface for contacting a chip, and a recess, wherein the recess is configured for confining an amount of liquid adhesive in the recess for bonding the substrate to the chip in a bonding area.

The recess is arranged on the same outer surface of the substrate as the predetermined contact area. Attributes of the recess, such as depth, width and position, may be configured to accommodate and confine the amount of liquid adhesive in order to provide a suitable bonding layer in the bonding area.

In an embodiment the substrate may comprise a plurality of recesses. Each of the plurality of recesses may arrange an amount of liquid adhesive for bonding one chip and may arrange an amount of liquid adhesive for bonding a plurality of chips. The substrate may comprise a plurality of predetermined contact areas for contacting a number of chips. For example two grooves may be provided, each extending along two predetermined contact areas, wherein each groove arranges an amount of liquid adhesive for bonding two chips, each of the two chips contacting the substrate in one of the two predetermined contact areas.

In an aspect of the present invention a chip is provided for use in the method according to the present invention, the chip comprising a predetermined contact area on an outer surface for contacting a substrate and a recess, wherein the recess is configured for confining an amount of liquid adhesive in the recess for bonding the chip to the substrate in a bonding area. The recess is arranged on the same outer surface of the chip as the predetermined contact area. Any suitable advantage feature disclosed hereinabove may be applied mutatis-mutandis.

In an aspect of the present invention an inkjet print head is provided for ejecting droplets of fluid, the inkjet print head comprising a chip and a substrate, wherein the chip and the substrate contact each other in a predetermined contact area and are bonded to each other by an amount of adhesive, wherein at least one of the chip and the substrate comprises a recess, wherein the recess is configured for confining the amount of adhesive in the recess for bonding the chip to the substrate in a bonding area. The direct contact in the predetermined contact area also provides a heat flow path between the substrate and the chip. A contact area in which the chip has a direct contact to the substrate provides a substantially higher heat flow rate than a bonding area in which a bonding layer is present between the chip and the substrate. For example in hotmelt ink jet applications, in which an ink jet print head is operated at elevated temperature, a controlled heat flow from the substrate towards the chip is important in order to maintain the chip at a predetermined elevated temperature. In the present invention the predetermined contact area may be selected in order to provide an accurately controllable heat flow rate between the substrate and the chip.

In an embodiment of the inkjet print head, the inkjet print head further comprises a fluid channel for retaining a fluid, wherein one of the substrate and the chip comprises a first part of the fluid channel and the other one of the substrate and the chip comprises a second part of the fluid channel, the substrate and chip being aligned to form the fluid channel, wherein at least a part of the predetermined contact area and the recess is arranged such that each of the part of the predetermined contact area and the recess surrounds the fluid channel for providing that the fluid is retained in the fluid channel. For example the recess surrounds the fluid channel and the chip is bonded to the substrate along the recess. A bonding layer in the recess provides a barrier suitable for retaining the fluid in the fluid channel. In another example the predetermined contact area surrounds the fluid channel. The bonding force between the chip and substrate may be sufficient such that the predetermined contact area provides a barrier suitable for retaining the fluid in the fluid channel. In a further example at least a part of the recess and the predetermined contact area surround a fluid channel or an array of multiple fluid channels.

Further scope of applicability of the present invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given herein below and the accompanying schematical drawings which are given by way of illustration only, and thus are not limitative of the present invention, and wherein.

DETAILED DESCRIPTION OF EMBODIMENTS

Figure 1A:
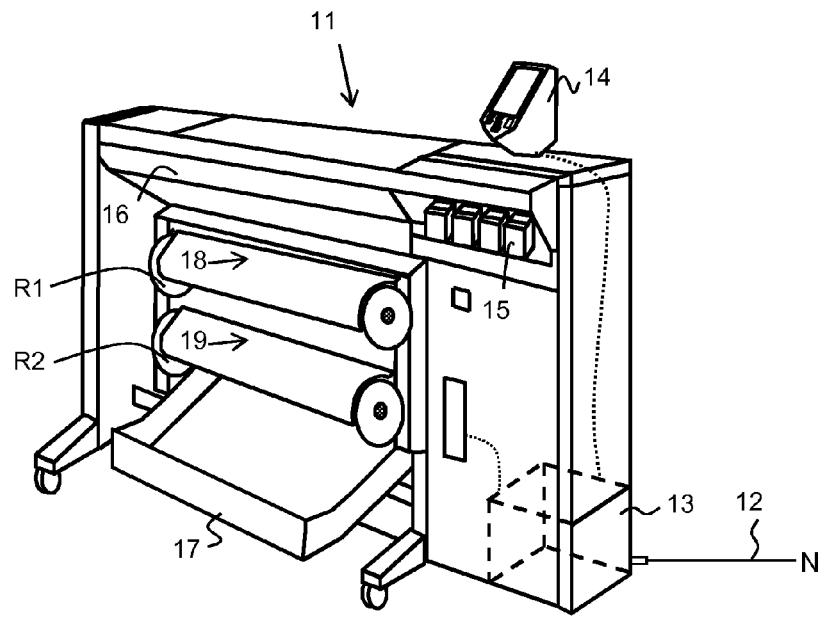
FIG. 1A shows an image forming apparatus, wherein printing is achieved using a wide format inkjet printer.

The present invention will now be described with reference to the accompanying drawings, wherein the same reference numerals have been used to identify the same or similar elements throughout the several views.

Figure 1B:
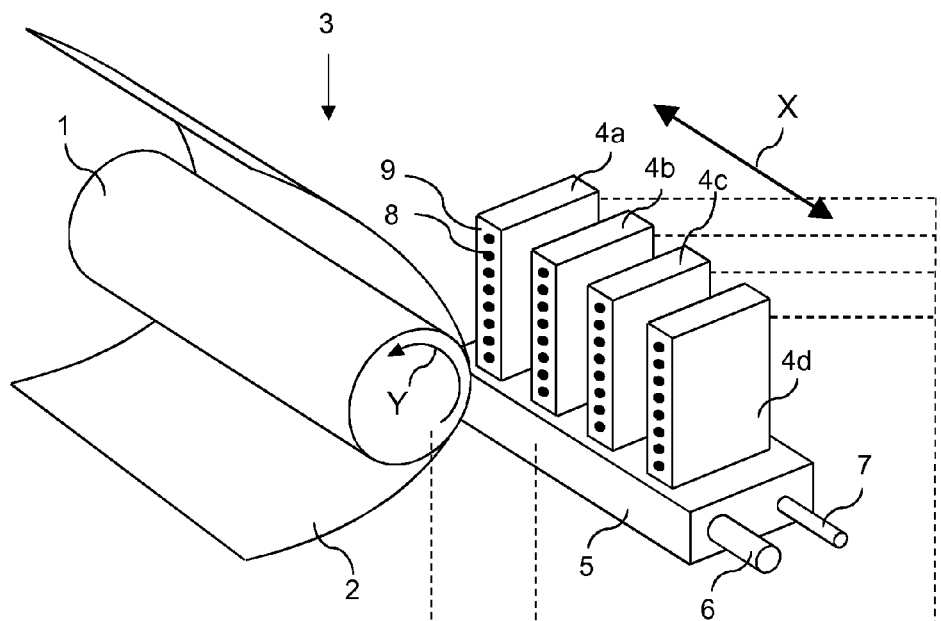
FIG. 1B shows an ink jet printing assembly.

FIG. 1A shows an image forming apparatus 11, wherein printing is achieved using a wide format inkjet printer. The wide-format image forming apparatus 11 comprises a housing 16, wherein the printing assembly, for example the ink jet printing assembly shown in FIG. 1B is placed. The image forming apparatus 11 also comprises a storage means for storing image receiving member 18, 19, a delivery station to collect the image receiving member 18, 19 after printing and storage means for marking material 15. In FIG. 1A, the delivery station is embodied as a delivery tray 17. Optionally, the delivery station may comprise processing means for processing the image receiving member 18, 19 after printing, e.g. a folder or a puncher. The wide-format image forming apparatus 11 furthermore comprises means for receiving print jobs and optionally means for manipulating print jobs. These means may include a user interface unit 14 and/or a control unit 13, for example a computer.

Images are printed on a image receiving member, for example paper, supplied by a roll 18, 19. The roll 18 is supported on the roll support R1, while the roll 19 is supported on the roll support R2. Alternatively, cut sheet image receiving members may be used instead of rolls 18, 19 of image receiving member. Printed sheets of the image receiving member, cut off from the roll 18, 19, are deposited in the delivery tray 17.

Each one of the marking materials for use in the printing assembly are stored in four containers 15 arranged in fluid connection with the respective print heads for supplying marking material to said print heads.

The local user interface unit 14 is integrated to the print engine and may comprise a display unit and a control panel. Alternatively, the control panel may be integrated in the display unit, for example in the form of a touch-screen control panel. The local user interface unit 14 is connected to a control unit 13 placed inside the printing apparatus 11. The control unit 13, for example a computer, comprises a processor adapted to issue commands to the print engine, for example for controlling the print process. The image forming apparatus 11 may optionally be connected to a network N. The connection to the network N is diagrammatically shown in the form of a cable 12, but nevertheless, the connection could be wireless. The image forming apparatus 11 may receive printing jobs via the network. Further, optionally, the controller of the printer may be provided with a USB port, so printing jobs may be sent to the printer via this USB port.

FIG. 1B shows an ink jet printing assembly 3. The ink jet printing assembly 3 comprises supporting means for supporting an image receiving member 2. The supporting means are shown in FIG. 1B as a platen 1, but alternatively, the supporting means may be a flat surface. The platen 1, as depicted in FIG. 1B, is a rotatable drum, which is rotatable about its axis as indicated by arrow A. The supporting means may be optionally provided with suction holes for holding the image receiving member in a fixed position with respect to the supporting means. The ink jet printing assembly 3 comprises print heads 4a-4d, mounted on a scanning print carriage 5. The scanning print carriage 5 is guided by suitable guiding means 6, 7 to move in reciprocation in the main scanning direction B. Each print head 4a-4d comprises an orifice surface 9, which orifice surface 9 is provided with at least one orifice 8. The print heads 4a-4d are configured to eject droplets of marking material onto the image receiving member 2. The platen 1, the carriage 5 and the print heads 4a-4d are controlled by suitable controlling means 10a, 10b and 10c, respectively.

The image receiving member 2 may be a medium in web or in sheet form and may be composed of e.g. paper, cardboard, label stock, coated paper, plastic or textile. Alternatively, the image receiving member 2 may also be an intermediate member, endless or not. Examples of endless members, which may be moved cyclically, are a belt or a drum. The image receiving member 2 is moved in the sub-scanning direction A by the platen 1 along four print heads 4a-4d provided with a fluid marking material.

A scanning print carriage 5 carries the four print heads 4a-4d and may be moved in reciprocation in the main scanning direction B parallel to the platen 1, such as to enable scanning of the image receiving member 2 in the main scanning direction B. Only four print heads 4a-4d are depicted for demonstrating the invention. In practice an arbitrary number of print heads may be employed. In any case, at least one print head 4a-4d per color of marking material is placed on the scanning print carriage 5. For example, for a black-and-white printer, at least one print head 4a-4d, usually containing black marking material is present. Alternatively, a black-and-white printer may comprise a white marking material, which is to be applied on a black image-receiving member 2. For a full-color printer, containing multiple colors, at least one print head 4a-4d for each of the colors, usually black, cyan, magenta and yellow is present. Often, in a full-color printer, black marking material is used more frequently in comparison to differently colored marking material. Therefore, more print heads 4a-4d containing black marking material may be provided on the scanning print carriage 5 compared to print heads 4a-4d containing marking material in any of the other colors. Alternatively, the print head 4a-4d containing black marking material may be larger than any of the print heads 4a-4d, containing a differently colored marking material.

The carriage 5 is guided by guiding means 6, 7. These guiding means 6, 7 may be rods as depicted in FIG. 1B. The rods may be driven by suitable driving means (not shown). Alternatively, the carriage 5 may be guided by other guiding means, such as an arm being able to move the carriage 5. Another alternative is to move the image receiving material 2 in the main scanning direction B.

Each print head 4a-4d comprises an orifice surface 9 having at least one orifice 8, in fluid communication with a pressure chamber containing fluid marking material provided in the print head 4a-4d. On the orifice surface 9, a number of orifices 8 is arranged in a single linear array parallel to the sub-scanning direction A. Eight orifices 8 per print head 4a-4d are depicted in FIG. 1B, however obviously in a practical embodiment several hundreds of orifices 8 may be provided per print head 4a-4d, optionally arranged in multiple arrays. As depicted in FIG. 1B, the respective print heads 4a-4d are placed parallel to each other such that corresponding orifices 8 of the respective print heads 4a-4d are positioned in-line in the main scanning direction B. This means that a line of image dots in the main scanning direction B may be formed by selectively activating up to four orifices 8, each of them being part of a different print head 4a-4d. This parallel positioning of the print heads 4a-4d with corresponding in-line placement of the orifices 8 is advantageous to increase productivity and/or improve print quality. Alternatively multiple print heads 4a-4d may be placed on the print carriage adjacent to each other such that the orifices 8 of the respective print heads 4a-4d are positioned in a staggered configuration instead of in-line. For instance, this may be done to increase the print resolution or to enlarge the effective print area, which may be addressed in a single scan in the main scanning direction. The image dots are formed by ejecting droplets of marking material from the orifices 8.

Upon ejection of the marking material, some marking material may be spilled and stay on the orifice surface 9 of the print head 4a-4d. The ink present on the orifice surface 9, may negatively influence the ejection of droplets and the placement of these droplets on the image receiving member 2. Therefore, it may be advantageous to remove excess of ink from the orifice surface 9. The excess of ink may be removed for example by wiping with a wiper and/or by application of a suitable anti-wetting property of the surface, e.g. provided by a coating.

Figure 1C:
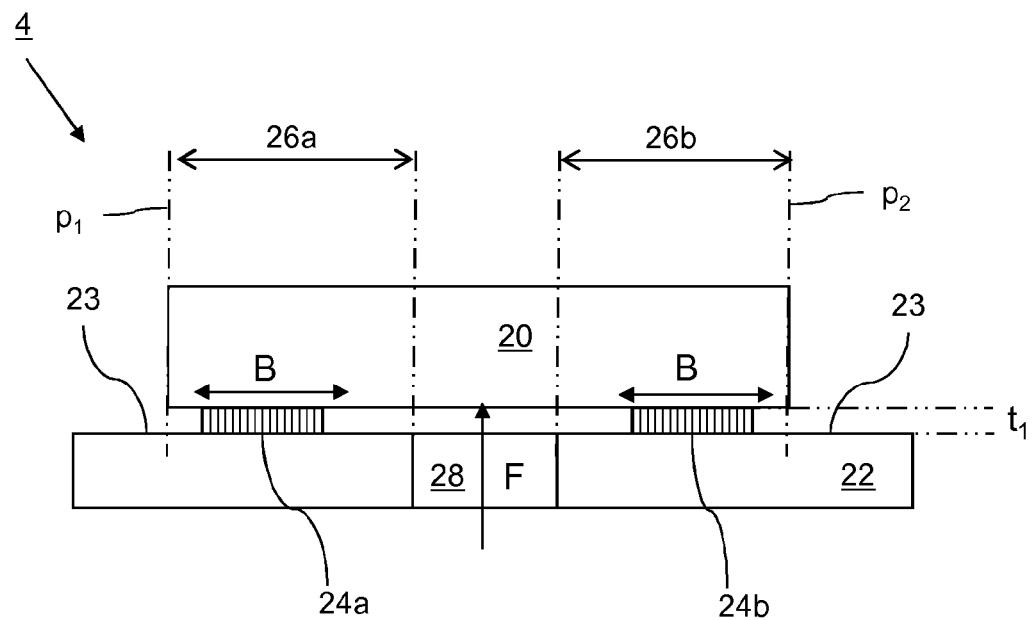
FIG. 1C-1D show a first phase and a second phase, respectively, of a prior art method for bonding a chip to a substrate.
Figure 1D:
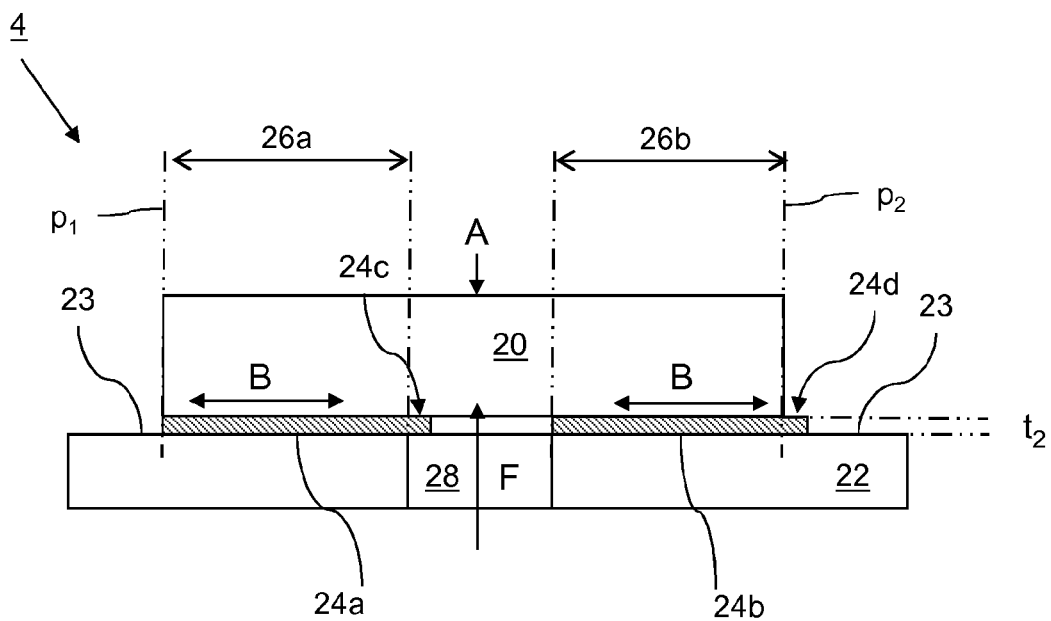

FIG. 1C-1D show a first phase and a second phase, respectively, of a prior art method for bonding a chip to a substrate. In FIG. 1C a first phase of the method is shown. An inkjet print head 4 comprises a substrate 22 and at least one chip 20. The chip 20 comprises a plurality of pressure chambers and a plurality of actuators (not shown) each actuator being arranged for providing a fluid pressure in one of the pressure chambers. The chip 20 is bonded by an adhesive to the substrate 22. In order to bond the chip 20 to the substrate 22 in a first phase of a bonding method a layer of liquid adhesive 24a, 24b is applied on a surface of the substrate 22 having a thickness $t_1$ in order to provide a bonding layer on both sides of a fluid channel 28 during a second phase, which fluid channel 28 is provided in the substrate 22. The fluid channel 28 in operation of the print head 4 functions to supply a fluid towards the chip 20 in the direction as indicated by arrow F. In the first phase the chip 20 is arranged in contact with the layer of liquid adhesive 24a, 24b.

In FIG. 1D a second phase of the method is shown. In the second phase the chip 20 is moved with respect to the substrate 22 as indicated by arrow A in order to form the bonding layer in a bonding area 26a, 26b. During this phase a thickness $t_2$ of the bonding layer is determined ($t_2$ being smaller than $t_1$ in the first phase) and a position $p_1$, $p_2$ of the chip 20 with respect to the substrate 22 is maintained. During this phase the liquid adhesive 24a, 24b will spread on the surface of the substrate 22 in the lateral directions as indicated by arrow B. A controlled spreading of the liquid adhesive 24a, 24b inside the bonding area 26a, 26b is difficult to achieve, especially in case the liquid adhesive 24a, 24b has a low viscosity.

During this phase some liquid adhesive 24a, 24b may be moved outside of the desired bonding area 26a, 26b. In an example a part of the liquid adhesive 24c is moved in the fluid channel 28. In another example a part of the liquid adhesive 24d is moved adjacent to the chip 20 on the surface of the substrate 22, thereby limiting the space for other functional parts of the assembly of chip 20 and substrate 22, such as a flexible electronic connection element (not shown).

In a third phase the liquid adhesive 24a, 24b is cured in order to form an adhesive bonding layer in between the chip 20 and the substrate 22. The liquid adhesive may be cured by heat. The heat in order to cure the liquid adhesive 24a, 24b may be supplied by heating the substrate.

Figure 2A:
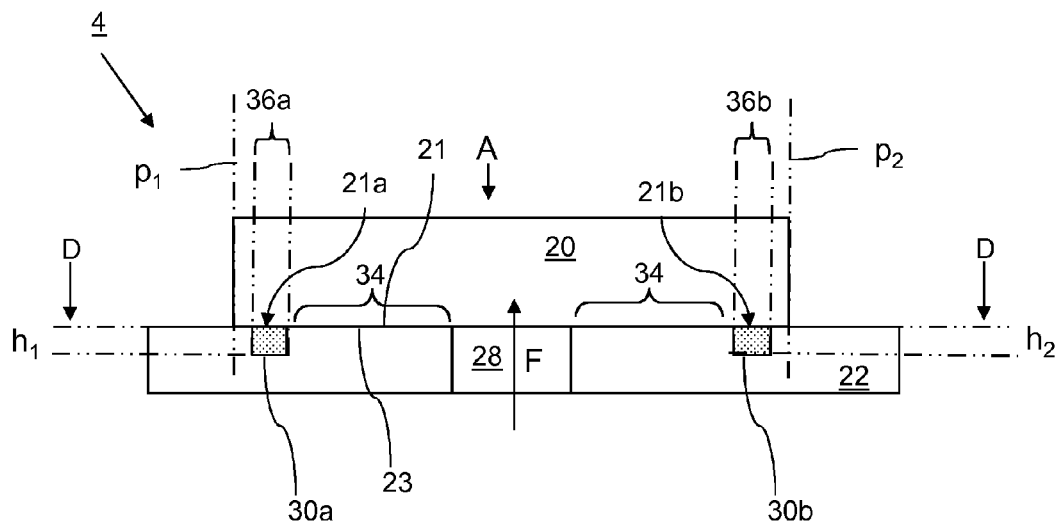
FIGS. 2A and 2B show a first phase and a second phase of a method according to a first embodiment of the invention, wherein a substrate comprising two recesses is used.
Figure 2B:
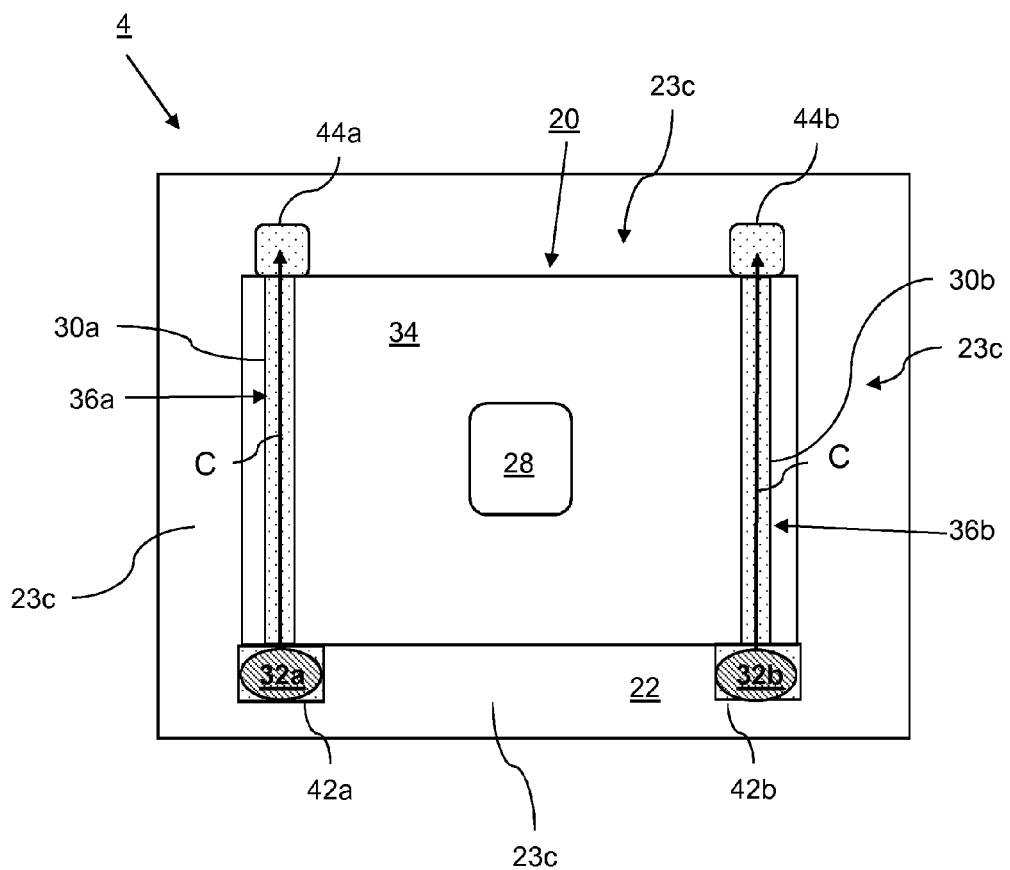

FIGS. 2A and 2B show a first phase and a second phase of a method according to a first embodiment of the invention, wherein a substrate comprising two recesses is used. In FIG. 2A an inkjet print head 4 is shown comprising a substrate 22 and at least one chip 20. The chip 20 comprises a plurality of pressure chambers and a plurality of actuators each actuator being arranged for providing a fluid pressure in one of the pressure chambers. The chip 20 is bonded by an adhesive to the substrate 22. The substrate 22 comprises a first recess 30a and a second recess 30b. The first recess 30a is provided on a surface 23 of the substrate 22 in a first bonding area 36a. The second recess 30b is provided on the surface 23 of the substrate 22 in a second bonding area 36b. A predetermined contact area 34 is arranged on the same surface 23 for providing a direct contact to a surface 21 of the chip 20. A fluid channel 28 is provided in the substrate 22. The fluid channel 28 in operation of the print head 4 functions to supply a fluid towards the chip 20 in the direction as indicated by arrow F.

In FIG. 2A a first phase is shown of the method to bond the chip 20 to the substrate 22. In a first phase of the bonding method the chip 20 is arranged in contact with substrate 22 in the predetermined contact area 34 (as indicated by arrow A). During this phase a position $p_1$, $p_2$ of the chip 20 with respect to the substrate 22 is determined. Furthermore after the first phase a height $h_1$ of a bonding layer to be formed in the bonding area 36a is confined by a distance between a depth of the first recess 30a and surface part 21a of the chip 20 above the first recess 30a. Accordingly a height $h_2$ of a bonding layer to be formed in the bonding area 36b is confined by a distance between a depth of the second recess 30b and surface part 21b of the chip 20 above the second recess 30b.

FIG. 2B shows a cross-section along the line D-D in FIG. 2A through the contact area 34. The chip 20 directly contacts the substrate 22 in the predetermined contact area 34. In FIG. 2B a second phase is shown of the method to bond the chip 20 to the substrate 22. The first recess 30a further comprises a first filling portion 42a and a first degassing portion 44a. The second recess 30b further comprises a second filling portion 42b and a second degassing portion 44b. In the second phase a liquid adhesive 32a is provided in the first filling portion 42a and a liquid adhesive 32b is provided in the second filling portion 42b. Next the liquid adhesive 32a, 32b is moved along a longitudinal direction of each of the recess 30a, 30b, respectively, as indicated by arrows C. Thereby the liquid adhesive 32a, 32b is moved towards the first and second degassing portion 44a, 44b, respectively. As a result a bonding layer is formed in the bonding area 36a, 36b, respectively.

The liquid adhesive 32a, 32b is moved along the longitudinal direction of the recess 30a, 30b by providing a pressure to the liquid adhesive 32a, 32b inside the filling portion 42a, 42b. Alternatively the liquid adhesive 32a, 32b may be moved along the longitudinal direction of the recess 30a, 30b by capillary forces. The capillary forces are provided by interaction between the surfaces of the recess 30a, 30b and the liquid adhesive 32a, 32b.

During this phase the liquid adhesive 32a, 32b is confined in the recess 30a, 30b and substantially no liquid adhesive is moved in between the chip 20 and the substrate 22 in the predetermined contact area 34. The predetermined contact area 34 surrounds the fluid channel 28. The predetermined contact area 34 is suitable in operation of the print head 4 to function as a barrier for keeping a fluid retained inside the fluid channel 28. The recess 30a, 30b are configured to restrict the spreading of the liquid adhesive and to confine the liquid adhesive 32a, 32b in the recess 30a, 30b. As a result the surface 23c of the substrate 22 adjacent to the chip 20 remains substantially free from liquid adhesive residues and can be used for other functional parts of the assembly of chip 20 and substrate 22, such as a flexible electronic connection element (not shown).

Depending on design requirements, some spreading of the liquid adhesive 32a, 32b outside the recess 30a, 30b may be tolerated.

In a third phase the liquid adhesive 32a, 32b is cured in order to form an adhesive bonding layer in between the chip 20 and the substrate 22. The liquid adhesive may be cured by heat. The heat may be supplied to the liquid adhesive 32a, 32b by heating the substrate 22.

Figure 3A:
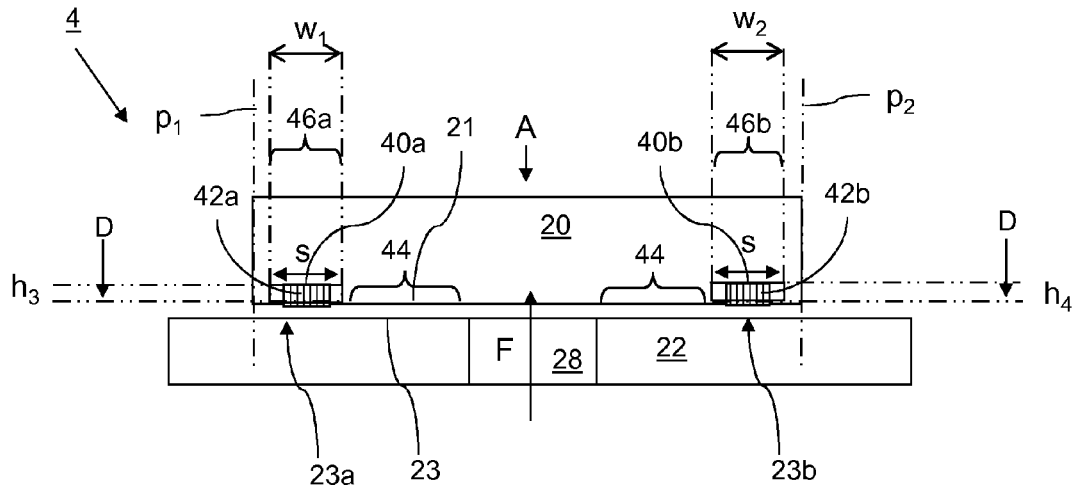
FIGS. 3A and 3B show a first phase and a second phase of a method according to a second embodiment of the invention, wherein a chip comprising two recesses is used.
Figure 3B:
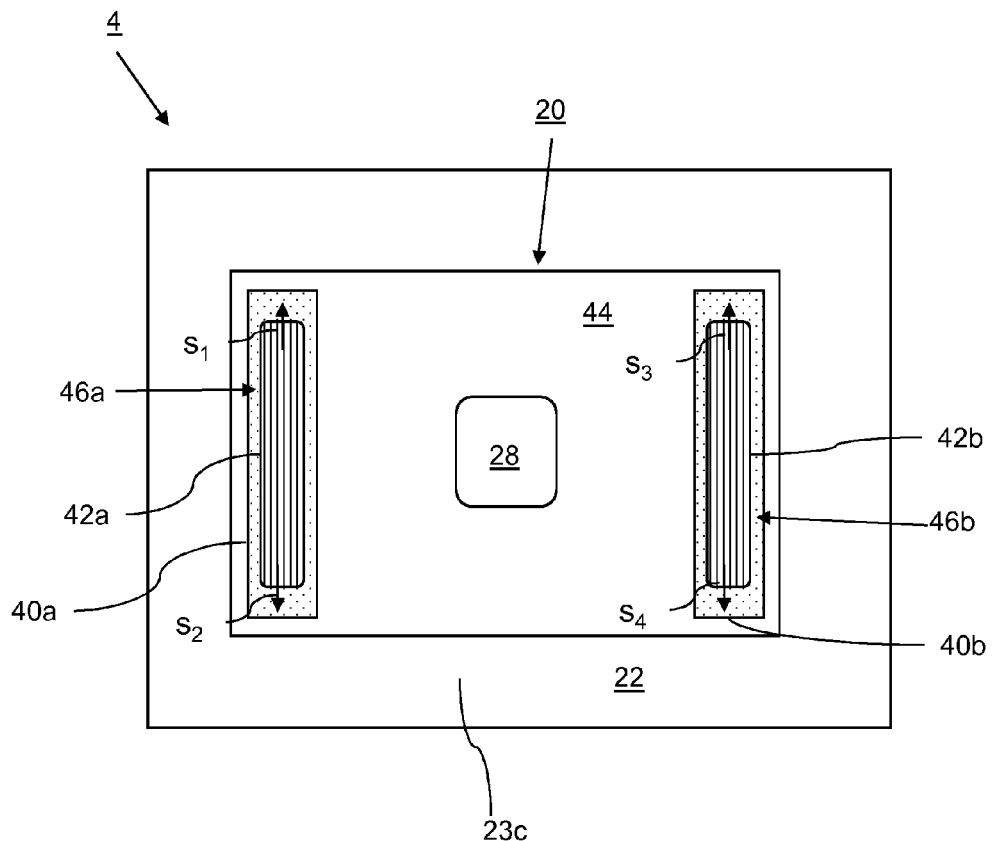

FIGS. 3A and 3B show a first phase and a second phase of a method according to a second embodiment of the invention, wherein a chip comprising two recesses is used. In FIG. 3A an inkjet print head 4 is shown comprising a substrate 22 and at least one chip 20. The chip 20 is bonded by an adhesive to the substrate 22. The chip 20 comprises a first recesses 40a and a second recess 40b. The two recesses 40a, 40b are provided on a surface 21 of the chip 20 in a bonding area 46a, 46b, respectively. A predetermined contact area 44 is arranged on the same surface 21 for providing a direct contact to a surface 23 of the chip 22. A fluid channel 28 is provided in the substrate 22. The fluid channel 28 in operation of the print head 4 functions to supply a fluid towards the chip 20 in the direction as indicated by arrow F.

In FIG. 3A a first phase is shown of the method to bond the chip 20 to the substrate 22. In the first phase a liquid adhesive 42a is provided in the first recess 40a and a liquid adhesive 42b is provided in the second recess 40b. In a second phase the chip 20 is arranged in contact with substrate 22 in the predetermined contact area 44 (as indicated by arrow A) in order to form a bonding layer in two bonding areas 46a, 46b. During this phase a position $p_1$, $p_2$ of the chip 20 with respect to the substrate 22 is determined. Furthermore after the first phase a height $h_3$ of a bonding layer to be formed in the bonding area 46a is confined by a distance between a depth of the recess 40a and a surface part 23a of the substrate 22 below the first recess 40a. A height $h_4$ of a bonding layer to be formed in the bonding area 46b is confined by a distance between a depth of the recess 40b and a surface part 23b of the substrate 22 below the second recess 40b. Furthermore a lateral spreading of the liquid adhesive 42a, 42b (as indicated by arrows s) is confined by the width $w_1$, $w_2$ of the first and second recess 40a, 40b, respectively.

FIG. 3B shows a cross-section along the line D-D in FIG. 3A through the contact area 44. In FIG. 3B the second phase is shown of the method to bond the chip 20 to the substrate 22. In the second phase a part of the liquid adhesive 42a is moved in a direction along a longitudinal direction of the first recess 40a as indicated by arrows s1, s2 and a part of the liquid adhesive 42b is moved in a direction along a longitudinal direction of the second recess 40b as indicated by arrows s3, s4. The recesses 40a, 40b control the spreading of the liquid adhesive and are able to retain the liquid adhesive 42a, 42b. During this phase no liquid adhesive is moved in between the chip 20 and the substrate 22 in the predetermined contact area 44. The predetermined contact area 44 surrounds the fluid channel 28. The predetermined contact area 44 is able in operation of the print head 4 to function as a barrier for keeping a fluid retained inside the fluid channel 28. Each of the amounts of liquid adhesive 42a, 42b is suitably selected, such that the amount is enough to contact both the chip 20 and substrate 22 to provide a bonding layer between the chip 20 and the substrate 22. On the other hand each of the amounts of liquid adhesive 42a, 42b is suitably selected, such that the amount does not overfill the recess 40a, 40b, respectively, during the first and the second phase of the bonding method.

As a result the surface 23c of the substrate 22 adjacent to the chip 20 remains free from liquid adhesive residues and can be used for other functional parts of the assembly of chip 20 and substrate 22, such as a flexible electronic connection element (not shown).

Figure 4A:
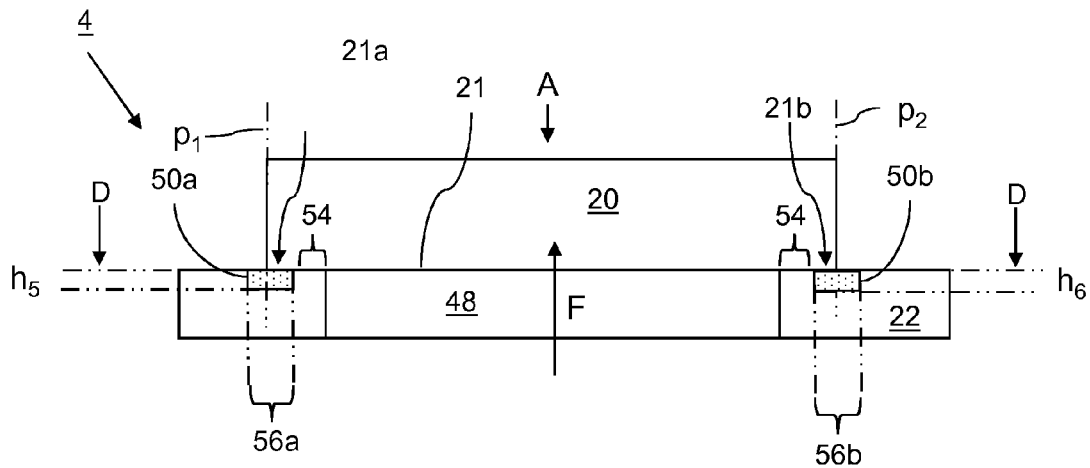
FIG. 4A-4D show three phases of a method according to a third embodiment of the invention, wherein a substrate is used comprising a recess surrounding a fluid channel.
Figure 4B:
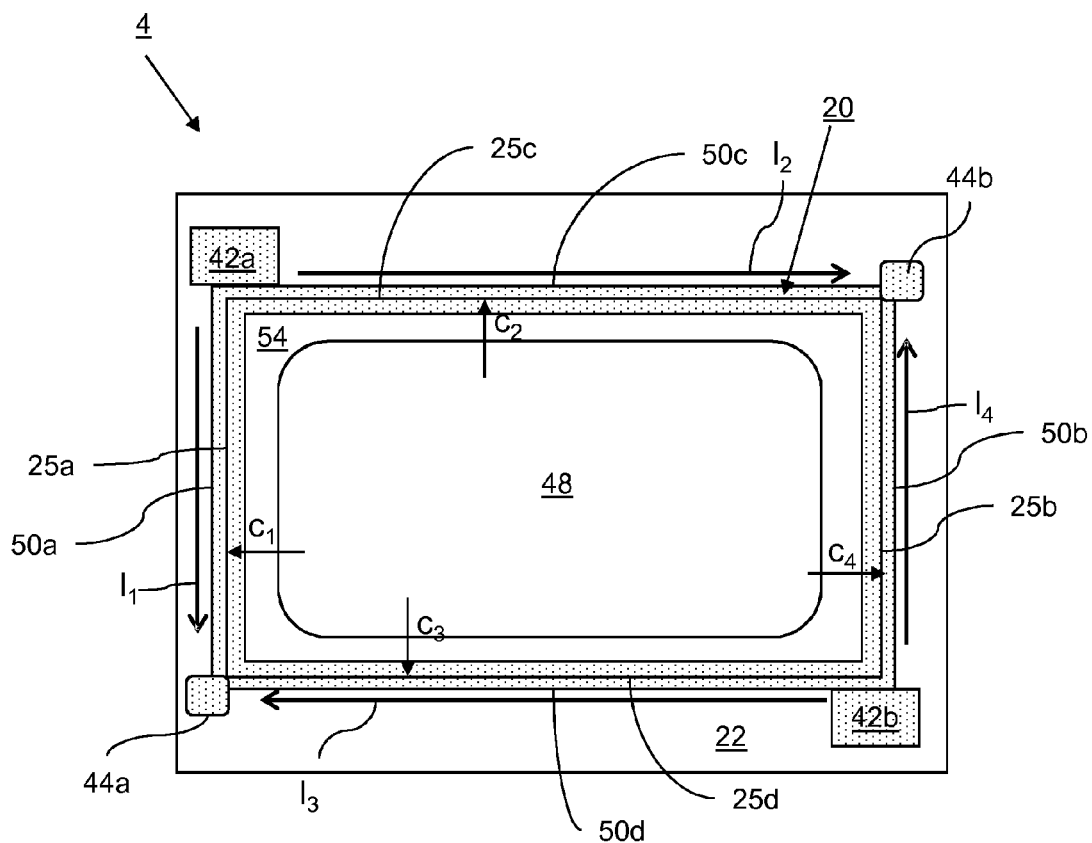
Figure 4C:
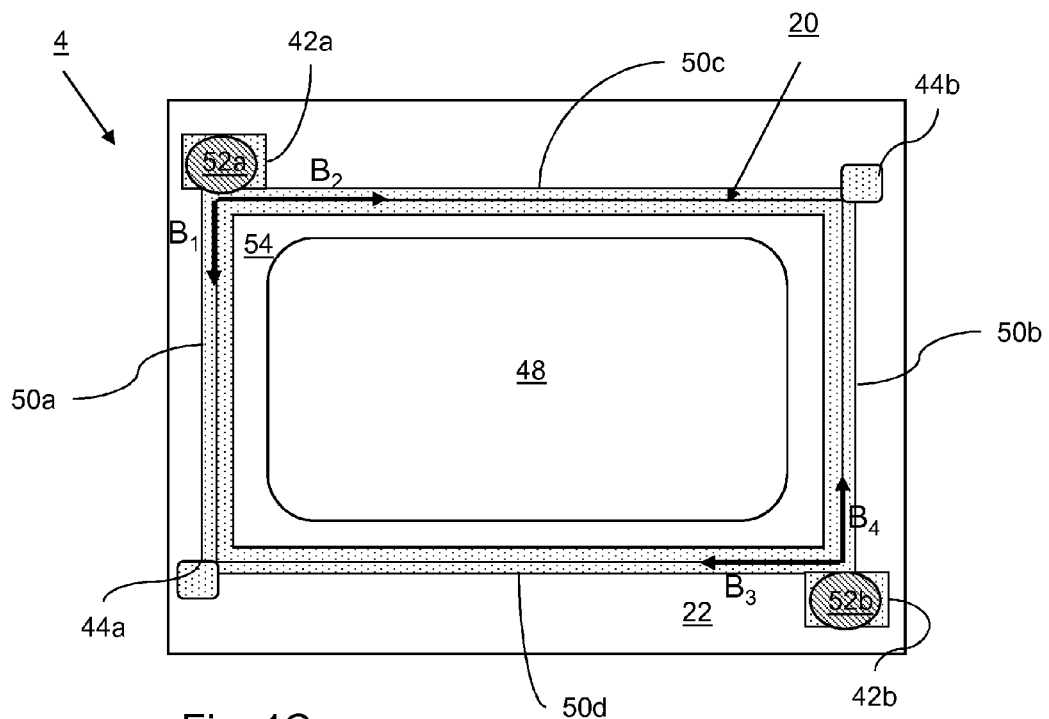
Figure 4D:
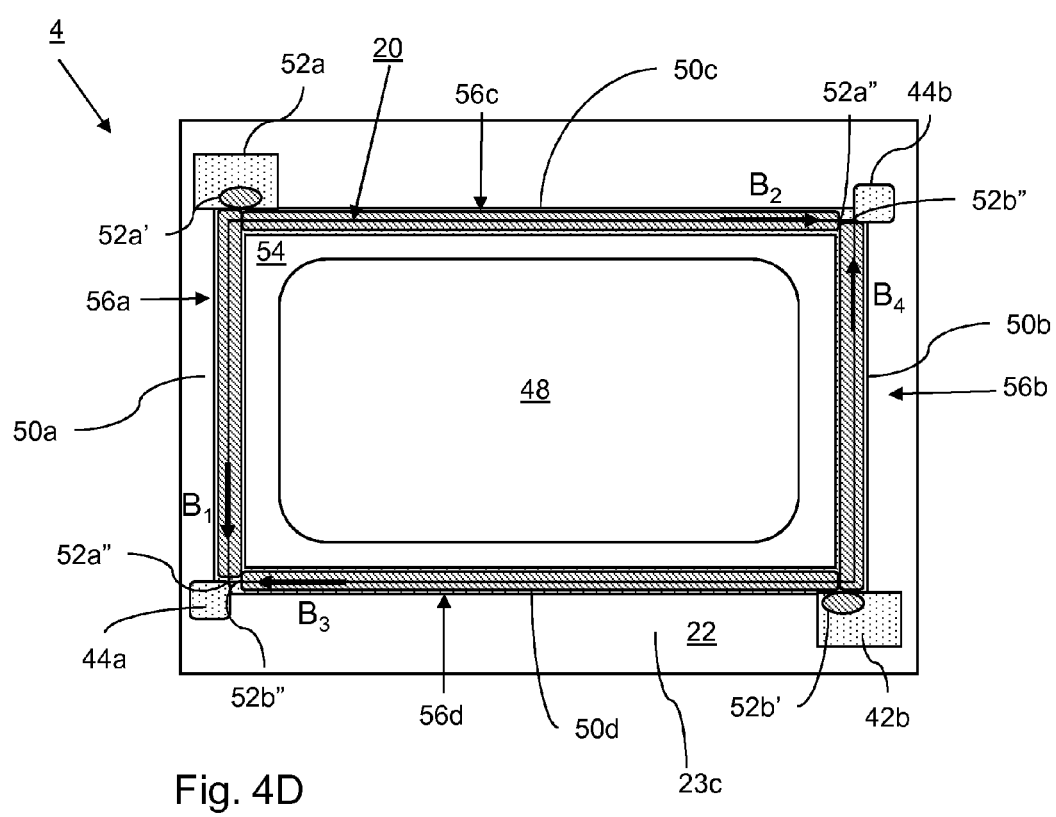

FIG. 4A-4D show three phases of a method according to a third embodiment of the invention, wherein a substrate is used comprising a recess surrounding a fluid channel. FIGS. 4A and 4B show a first phase, FIG. 4C shows a second phase and FIG. 4D shows a third phase, respectively.

In FIG. 4A an inkjet print head 4 is shown comprising a substrate 22 and at least one chip 20. The chip 20 is bonded by an adhesive to the substrate 22. The substrate 22 comprises one recess 50 which comprises recess portions 50a, 50b, 50c, 50d (the latter two only shown in FIG. 4B), which are arranged on surface 23 of the substrate 22. A predetermined contact area 54 is arranged on the same surface 23 of the substrate 22 for providing a direct contact to a surface 21 of the chip 20. The recess portions 50a, 50b, 50c, 50d surround the predetermined contact area 54. Further a fluid channel 48 is provided in the substrate 22. The fluid channel 48 in operation of the print head 4 functions to supply a fluid towards the chip 20 in the direction as indicated by arrow F. The predetermined contact area 54 is small relative to the size of a cross section of the fluid channel 48 in the plane of the predetermined contact area 54 (as shown in FIG. 4B).

In FIG. 4A a first phase is shown of the method to bond the chip 20 to the substrate 22. In a first phase of the bonding method the chip 20 is arranged in contact with substrate 22 in the predetermined contact areas 54 (as indicated by arrow A). During this phase a position $p_1$, $p_2$ of the chip 20 with respect to the substrate 22 is determined. The surface 21 of chip 20 partly covers the recess portions 50a, 50b. Furthermore after the first phase a height $h_5$ of a bonding layer to be formed in a bonding area 56a is confined by a distance between a depth of the recess portions 50a and surface part 21a of the chip 20 above the recess portions 50a. Accordingly a height $h_6$ of a bonding layer to be formed in a bonding area 56b is confined by a distance between a depth of the recess portions 50b and surface part 21b of the chip 20 above the recess portions 50b. Height $h_5$ and height $h_6$ may be suitably selected in order to provide a bonding layer having a predetermined thickness.

FIG. 4B shows a cross-section along the line D-D in FIG. 4A through the contact area 54. Each of the recess portions 50a, 50b, 50c, 50d has a longitudinal direction as indicated by arrows $I_1$, $I_2$, $I_3$, $I_4$, respectively. The recess further comprises two filling portions 42a, 42b and two degassing portions 44a, 44b. The filling portion 42a is connected to a first end of two recess portions 50a, 50c and the filling portion 42b is connected to a first end of two recess portions 50b, 50d. The degassing portion 42a is connected to a second end of two recess portions 50a, 50d and the degassing portion 44b is connected to a second end of two recess portions 50b, 50c.

The chip 20 is arranged with respect to the substrate 22 such that a perimeter part 25a, 25b, 25c, 25d of the chip 20 partly covers each of the recess portions 50a, 50b, 50c, 50d. The chip 20 directly contacts the substrate 22 in the predetermined contact area 54. Each part of the perimeter 25a, 25b, 25c, 25d is arranged over one of the recess portions 50a, 50b, 50c, 50d, respectively. Each of the perimeter parts 25a, 25b, 25c, 25d is arranged along the longitudinal direction $I_1$, $I_2$, $I_3$, $I_4$, respectively, such that the recess portion is partly covered in a second direction $c_1$, $c_2$, $c_3$, $c_4$, respectively. Each of the second directions $c_1$, $c_2$, $c_3$, $c_4$ is substantially perpendicular to the longitudinal direction $I_1$, $I_2$, $I_3$, $I_4$ in the plane of the predetermined contact area 54.

FIG. 4C shows a cross-section along the line D-D in FIG. 4A through the contact area 54. In FIG. 4C a second phase of the method is shown. In the second phase an amount of liquid adhesive 52a is provided in the filling portion 42a and an amount of liquid adhesive 52b is provided in the filling portion 42b. Subsequently the liquid adhesive 52a is moved in the recess portions 50a, 50c as indicated by arrows $B_1$, $B_2$ and the liquid adhesive 52b is moved in the recess portions 50b, 50d as indicated by arrows $B_3$, $B_4$. A volume of each of the filling portions 42a, 42b is selected based on the amount of liquid adhesive 52a, 52b provided in the second phase. The volume of each of the filling portions 42a, 42b may be suitably selected such that filling portion is able to retain the liquid adhesive 52a, 52b before the liquid adhesive is moved in one of the recess portions 50a, 50b, 50c, 50d.

FIG. 4D shows a cross-section along the line D-D in FIG. 4A through the contact area 54. In FIG. 4D a third phase of the method is shown. A part of the liquid adhesive 52a is moved along the longitudinal direction $B_1$ of recess portion 50a, and another part of the liquid adhesive 52a is moved along the longitudinal direction $B_2$ of the recess portion 50c towards one of the degassing portions 44a, 44b respectively by capillary forces. A part of the liquid adhesive 52b is moved along the longitudinal direction $B_3$ of recess portion 50d, and another part of the liquid adhesive 52b is moved along the longitudinal direction $B_4$ of the recess portion 50b towards one of the degassing portions 44a, 44b respectively by capillary forces.

The degassing portions 44a, 44b support the degassing of the recess portions 50a, 50b, 50c, 50d. However in case the recess portions 50a, 50b, 50c, 50d are only partly covered by the chip 20, the non-covered areas of the recess portions also support the degassing processes during filling of the recess portions 50a, 50b, 50c, 50d with liquid adhesives 52a, 52b.

The capillary forces are provided by physical interaction between the surfaces of the recess portions 50a, 50b, 50c, 50d and the liquid adhesive 52a, 52b. After the third phase a part of the liquid adhesive 52a', 52b' may remain inside the filling portions 42a, 42b. A part of the liquid adhesive 52a", 52b" has moved to the second end of each of the recess portions 50a, 50b, 50c, 50d. As a result a bonding layer is formed in the bonding areas 56a, 56b, 56c, 56d.

During this phase substantially no liquid adhesive is moved in between the chip 20 and the substrate 22 in the predetermined contact area 54. The predetermined contact area 54 surrounds the fluid channel 48.

In a fourth phase (not shown) the liquid adhesive is cured in order to form an adhesive bonding layer in the bonding areas 56a, 56b, 56c, 56d in between the chip 20 and the substrate 22. The liquid adhesive may be cured by heat. The heat may be supplied to the liquid adhesive by heating the substrate 22. Alternatively the liquid adhesive may be radiation curable and may be cured by providing radiation at each position along the longitudinal direction of each of the recess portions 50a, 50b, 50c, 50d.

After the fourth phase the predetermined contact area 54 is able in operation of the print head 4 to function as a barrier for keeping a fluid retained inside the fluid channel 48. The predetermined contact area 54 also functions as a barrier for keeping the liquid adhesives 52a, 52b outside the fluid channel 48. Furthermore the bonding layer in the bonding areas 56a, 56b, 56c, 56d surrounds the predetermined contact area 54 and the fluid channel 48 and may provide an additional barrier for keeping a fluid retained inside the fluid channel 48. This additional barrier is especially advantageous in case the barrier, which is provided by the predetermined contact area 54, is insufficient to keep a fluid retained inside the fluid channel 48.

Figure 5A:
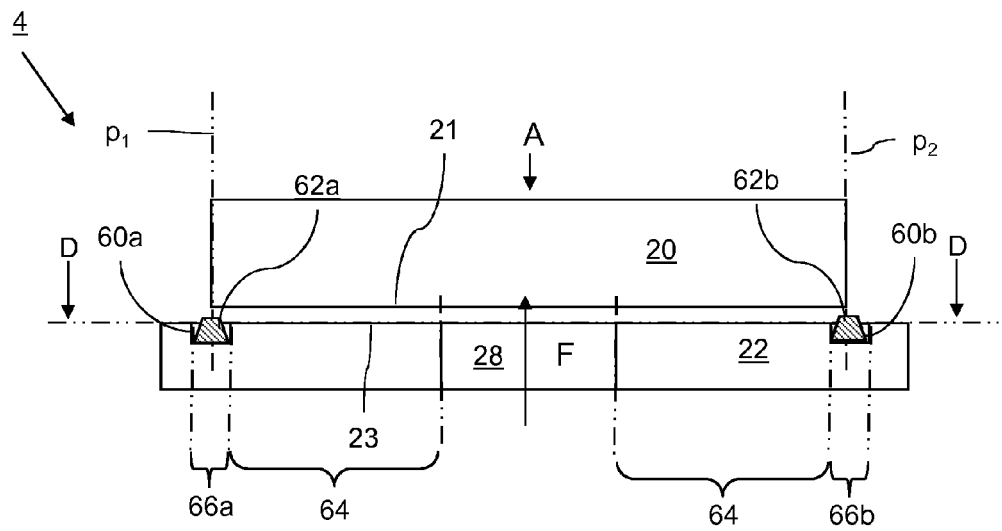
FIGS. 5A and 5B show a first phase and a second phase of a method according to a fourth embodiment of the invention, wherein a substrate is used comprising a plurality of recesses along an intended location of a perimeter of a chip.
Figure 5B:
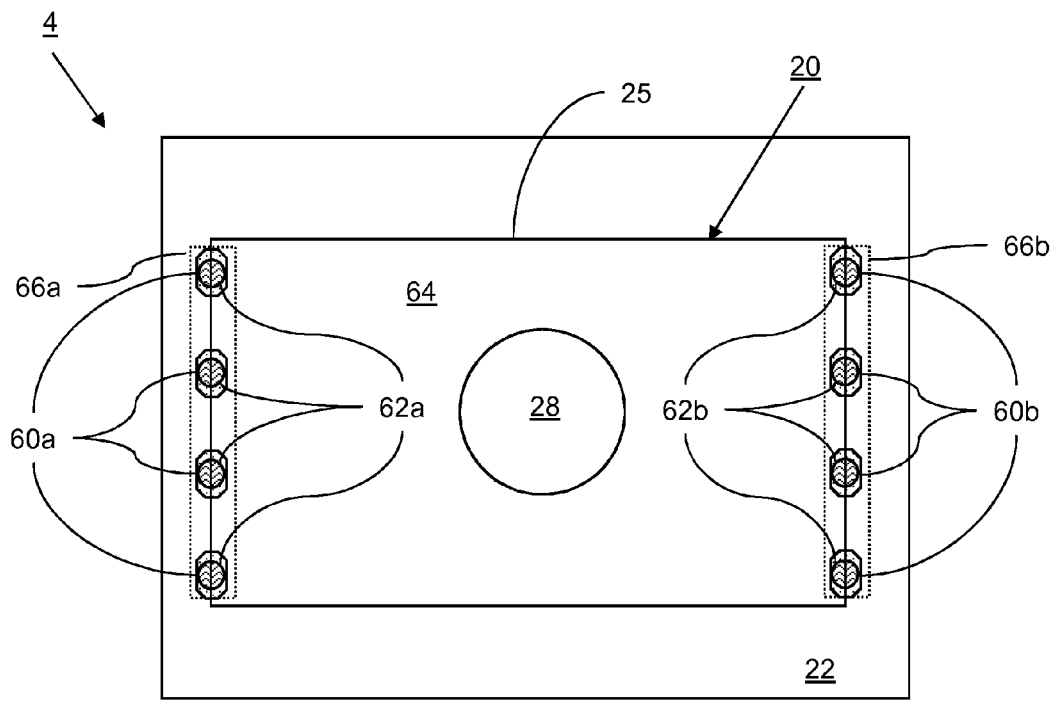

FIGS. 5A and 5B show a first phase and a second phase of a method according to a fourth embodiment of the invention, wherein a substrate is used comprising a plurality of recesses along an intended location of a perimeter of a chip.

In FIG. 5A an inkjet print head 4 is shown, comprising a substrate 22 and at least one chip 20. The chip 20 is bonded by an adhesive to the substrate 22. The substrate 22 comprises a first plurality of recesses 60a and a second plurality of recesses 60b arranged on surface 23 as shown in FIG. 5B. A predetermined contact area 64 is arranged on the same surface 23 of the substrate 22 for providing a direct contact to a surface 21 of the chip 20. The predetermined contact area 64 surrounds a fluid channel 28, which is provided in the substrate 22 (shown in FIG. 5B). The fluid channel 28 in operation of the print head 4 functions to supply a fluid towards the chip 20 in the direction as indicated by arrow F.

In a first phase of the bonding method a liquid adhesive 62a is provided in each of the first plurality of recesses 60a and a liquid adhesive 62b is provided in each of the second plurality of recesses 60b.

In a second phase the chip 20 is arranged in contact with substrate 22 in the predetermined contact area 64 (as indicated by arrow A) thereby forming a bonding layer in a first bonding area 66a and a second bonding area 66b. During this phase a position $p_1$, $p_2$ of the chip 20 with respect to the substrate 22 is determined. Furthermore in this phase a height of the bonding layer being formed in any of the recesses is determined by a distance between a depth of the recess and a part of the surface of the chip 20 above the recess.

FIG. 5B shows a cross section along the line D-D in FIG. 5A through the contact area 64. In FIG. 5B is shown that the chip 20 is arranged with respect to the substrate 22 such that a part of the perimeter 25 of the chip partly covers each of the plurality of recesses 60a, 60b. The regions of the first bonding area 66a and the second bonding area 66b are both indicated by a dashed line.

In a third phase (not shown) the liquid adhesive 62a, 62b is cured in order to form an adhesive bonding layer in between the chip 20 and the substrate 22. The liquid adhesive may be cured by heat. The heat may be supplied by heating the substrate 22. The total amount of liquid adhesive is smaller than in the first embodiment, second embodiment and third embodiment while maintaining a sufficient bonding force along the perimeter of the chip 20. The curing time of the liquid adhesive is shorter as the total amount of liquid adhesive in the bonding areas is smaller.

In this embodiment the liquid adhesive is provided in the recess before the chip is arranged in contact with the substrate. Alternatively the amount of liquid adhesive may be provided in the recess after arranging the chip in contact with the substrate. In another example a first amount of liquid adhesive may be provided in the recess before arranging the chip in contact with the substrate and a second amount of liquid adhesive may additionally be provided in the recess after arranging the chip in contact with the substrate. This embodiment enables faster bonding processing, while still being able to correct for an under fill deviation of a recess (i.e. too small amount of liquid adhesive provided to form a bonding layer). In all of these embodiments, depending on design requirements, some spreading of the amounts of liquid adhesive 62a, 62b outside the recesses 60a, 60b may be tolerated.

FIG. 6A-6D schematically illustrate a substrate, a first, a second phase and third phase, respectively, of a method according to a fifth embodiment of the invention, wherein a substrate is used for bonding two chips.

Figure 6A:
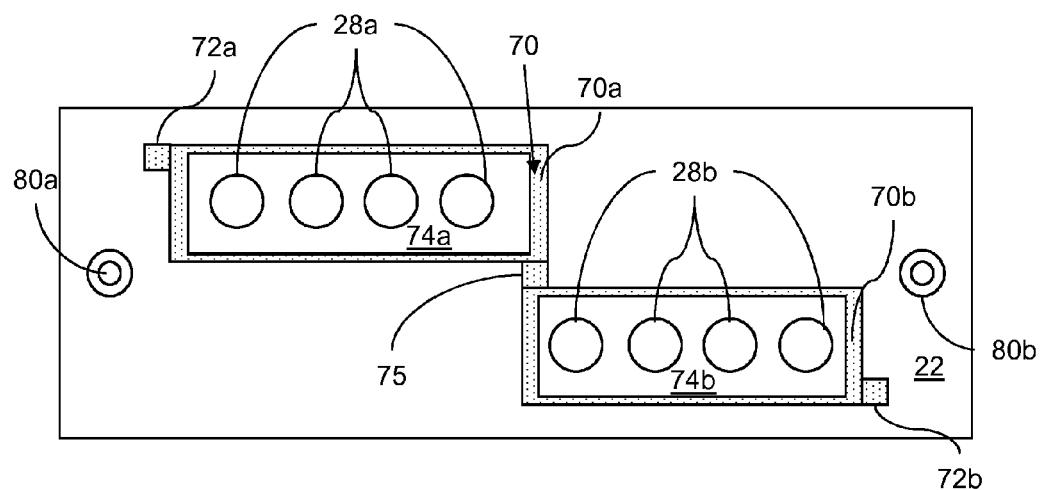
FIG. 6A-6D schematically illustrate a substrate, a first, a second phase and third phase, respectively, of a method according to a fifth embodiment of the invention, wherein a substrate is used for bonding two chips.

In FIG. 6A a substrate 22 is shown. The substrate 22 comprises one recess 70. The recess 70 comprises two filling portions 72a, 72b which are communicating with two recess portions 70a, 70b, respectively. The recess 70 further comprises a degassing portion 75, which communicates with both recesses portions 70a, 70b. Each of the two recess portions 70a, 70b surrounds a predetermined contact area 74a, 74b respectively. Within each predetermined contact area 74a, 74b a plurality of fluid channels is provided 28a, 28b. The substrate further comprises two positioning holes 80a, 80b, to accurately position the substrate with respect to a print head assembly 4.

Figure 6B:
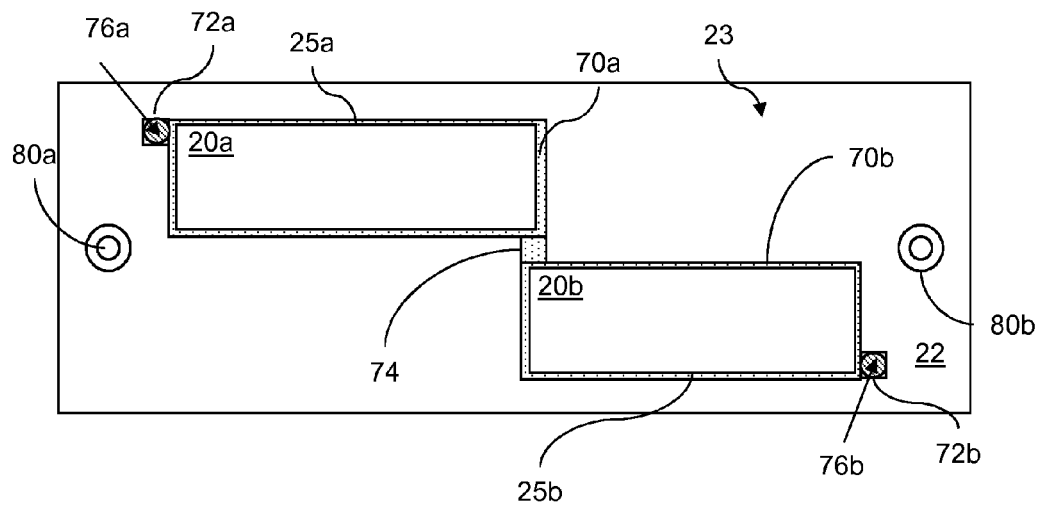

FIG. 6B shows a first phase of the method. In the first phase a chip 20a is arranged with respect to the substrate 22 such that a part of the perimeter 25a of the chip 20a partly covers the recess portion 70a. Another chip 20b is arranged with respect to the substrate 22 such that a part of the perimeter 25b of the chip 20b partly covers the recess portion 70b.

Subsequently an amount of liquid adhesive 76a is provided in the filling portion 72a and an amount of liquid adhesive 76b is provided in the filling portion 72b.

Figure 6C:
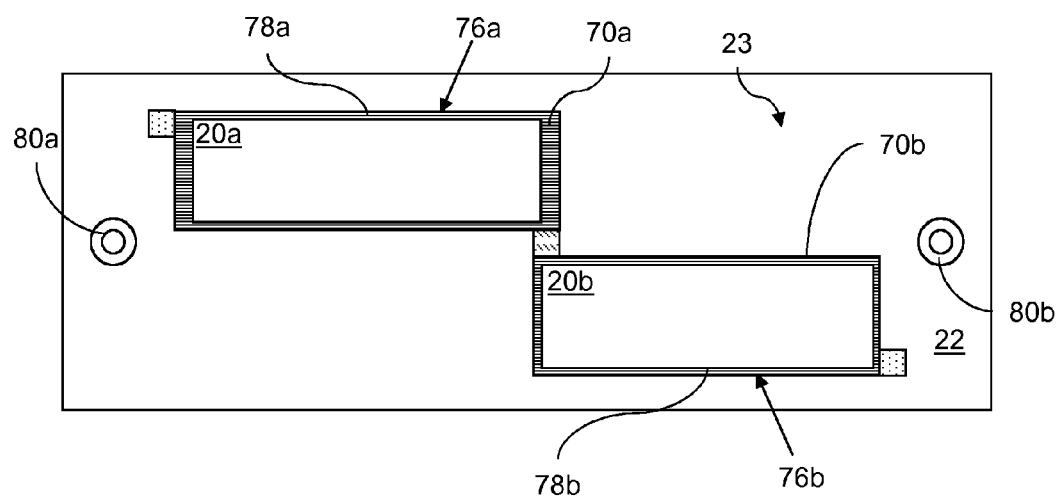

FIG. 6C shows a second phase of the method. In the second phase each of the amount of liquid adhesive 76a, 76b is moved by capillary forces towards the degassing portion 74 and each of the liquid adhesive 76a, 76b is accommodated along the recess portions 70a, 70b, respectively. Thereby a bonding layer 78a, 78b is formed. Substantially no liquid adhesive is moved in the predetermined contact area 74a, 74b (shown in FIG. 6A) and substantially no liquid adhesive is moved on the surface 23 of the substrate 22. Subsequently the liquid adhesive 76a, 76b is cured in order to form an adhesive bonding layer between the chip 20a, 20b and the substrate 22.

Figure 6D:
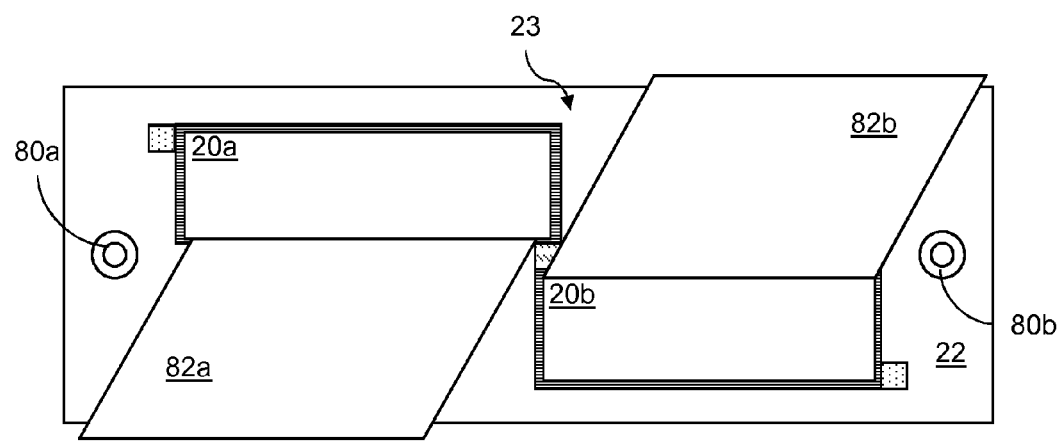

FIG. 6D shows a third phase of the method, in which phase a flexible electronic connection 82a is connected to the chips 20a and a flexible electronic connection 82b is connected to the chip 20b. During further processes of the assembly a fill may be provided on top of at least one of the chips 20a, 20b and on the surface 23 of the substrate in order to protect electric parts of the chip (such as wire bonding connections).

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims is herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of bonding a chip to a substrate, the method comprising the steps of:
   a) providing a chip, wherein the chip comprises a pressure chamber configured for containing a fluid, an actuator configured for providing a fluid pressure in the pressure chamber and a fluid channel for providing a fluid communication from a second fluid channel of the substrate towards the pressure chamber;
   b) providing a substrate, comprising the second fluid channel;
   c) providing a recess in one of the chip and the substrate;
   d) arranging the chip and the substrate in contact with each other thereby forming a predetermined contact area and at least partly covering the recess by the other one of the chip and the substrate;
   e) providing an amount of liquid adhesive in the recess only such that the liquid adhesive is confined inside the recess for providing a bonding layer in a bonding area arranged between the recess and said other one of the chip and the substrate; and
   f) curing the liquid adhesive, which is located in the recess, to bond the chip to the substrate,
   wherein the predetermined contact area formed during step d) provides a high friction force between the chip and the substrate such that a position of the chip is maintained stationary with respect to the substrate during the curing step f).

2. The method according to claim 1, wherein step d) comprises arranging the chip and the substrate such that at least a part of a perimeter of said other one of the chip and the substrate is arranged over the recess.

3. The method according to claim 2, wherein the recess extends in a first longitudinal direction and wherein step d) comprises arranging a part of the perimeter of said other one of the chip and the substrate along the first longitudinal direction such that the recess is partly covered in a second direction, which is substantially perpendicular to the first longitudinal direction in the plane of the predetermined contact area.

4. The method according to claim 1, wherein the recess provided in step c) further comprises a predetermined depth and after step e) the bonding layer is provided in the recess for bonding the chip to the substrate comprising a predetermined thickness.

5. The method according to claim 1, wherein step e) is performed prior to step d).

6. The method according to claim 5, wherein after step d) the recess is fully covered by said other one of the chip and the substrate.

7. The method according to claim 1, wherein the recess comprises a filling portion and wherein after step d) the filling portion is not covered by said other one of the chip and the substrate and step e) comprises providing the amount of liquid adhesive via the filling portion in the recess.

8. The method according to claim 7, wherein the recess further comprises a degassing portion and wherein after step d) the degassing portion is not covered by said other one of the chip and the substrate.

9. The method according to claim 7, wherein the recess further comprises a groove and wherein step c) comprises configuring the recess such that during or after step e) the liquid adhesive provided is moved by capillary forces along a longitudinal direction of the groove.

10. The method according to claim 7, wherein the recess further comprises a groove and wherein step e) comprises providing pressure to the liquid adhesive in the filling portion in order to move the liquid adhesive along a longitudinal direction of the groove.

11. The method according to claim 7, wherein a volume of the filling portion is selected based on the amount of liquid adhesive, and wherein step e) comprises temporarily retaining the amount of liquid adhesive in the filling portion.

* * * * *